United States Patent [19]
Wilhelm et al.

[11] Patent Number: 4,730,349
[45] Date of Patent: Mar. 8, 1988

[54] WIDEBAND FREQUENCY DIVIDER

[75] Inventors: Wilhelm Wilhelm; Zafer Incecik both of Munich, Fed. Rep. of Germany

[73] Assignee: Siemens Aktiengesellschaft, Berlin and Munich, Fed. Rep. of Germany

[21] Appl. No.: 6,298

[22] Filed: Jan. 20, 1987

Related U.S. Application Data

[63] Continuation of Ser. No. 733,513, May 13, 1985, abandoned.

[30] Foreign Application Priority Data

May 16, 1984 [DE] Fed. Rep. of Germany ....... 3418206

[51] Int. Cl.$^4$ ...................... H03L 7/00; H03K 21/00
[52] U.S. Cl. ..................................... 377/47; 377/116; 328/61; 307/269
[58] Field of Search .................... 377/47, 48, 115, 116, 377/117; 307/272 A, 272 R, 440, 448, 269; 328/61

[56] References Cited

U.S. PATENT DOCUMENTS

| | | | |
|---|---|---|---|
| 4,349,753 | 9/1982 | Scavuzzo | 307/272 A |
| 4,378,505 | 3/1983 | Scavuzzo | 307/272 A |
| 4,446,382 | 5/1984 | Moore et al. | 307/443 |
| 4,560,888 | 12/1985 | Oida | 307/272 A |

OTHER PUBLICATIONS

"Electronic Engineering", vol. 51, No. 625, Oct. 1979.

Primary Examiner—John S. Heyman
Attorney, Agent, or Firm—Herbert L. Lerner; Laurence A. Greenberg

[57] ABSTRACT

A bipolar clock-controlled bistable multivibrator circuit arrangement having a static memory cell formed of a D-master-slave flip-flop with a first inverted output signal fed back to a data input and with feedback loops, respectively, for intermediately storing output signals of the master and the slave. A dynamic memory cell is formed of the D-master-slave flip-flop with a second inverted output signal fed back to the data input. The second inverted output signal has gate propagation times performing intermediate memory functions in place of the feedback loops and includes a synchronizing device connected between the static and the dynamic memory cells. Means are provided for setting the circuit of the static memory cell in operation at relatively high clock frequencies. Thereby the useful frequency range of the multivibrator is at least doubled.

2 Claims, 4 Drawing Figures

U.S. Patent　　Mar. 8, 1988　　Sheet 1 of 2　　4,730,349
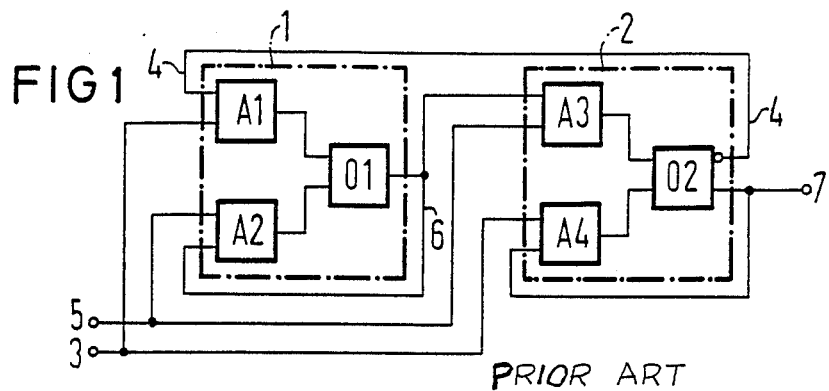
PRIOR ART
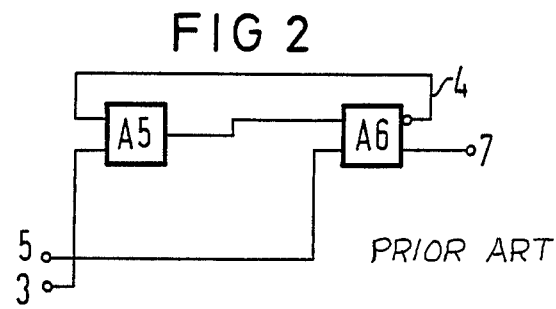
PRIOR ART
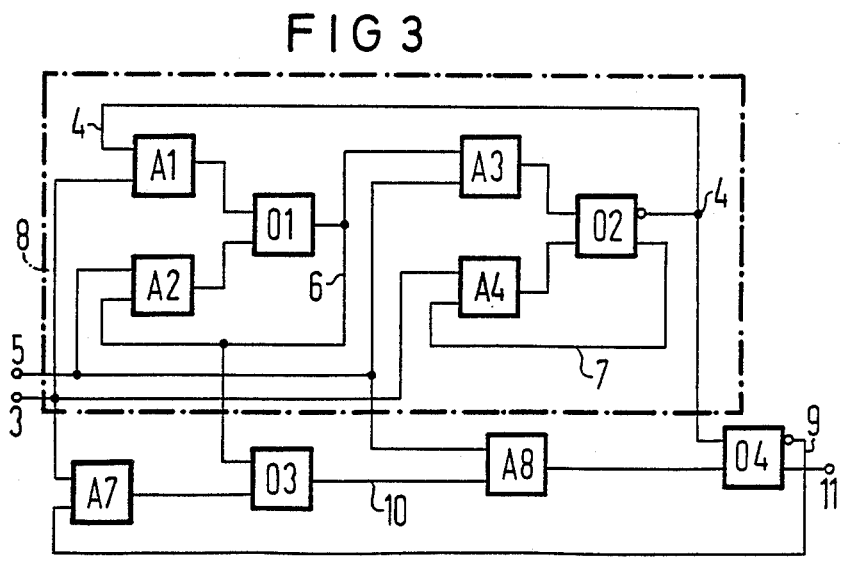

WIDEBAND FREQUENCY DIVIDER

This application is a continuation of application Ser. No. 733,513, filed May 13, 1985, now abandoned.

The invention relates to a frequency divider for digital circuits and, more particularly, to a bipolar clock-controlled bistable multivibrator circuit arrangement having a static memory cell formed of a D-master-slave flip flop with a first inverted output signal fed back to a data input and with feedback loops, respectively for intermediately storing output signals of the master and the slave, and a dynamic memory cell formed of the D-master-slave flipflop with a second inverted output signal fed back to the data input, the second inverted output signal having gate propagation times performing intermediate memory functions in place of the feedback loops. In digital technology, frequency dividers serve for dividing in half the frequency of an input signal, such as a clock signal, for example, and consequently, in the case of several serial functional elements, for reducing the frequency of the input signal by the corresponding power of two. Assuming the employment of manufacturing technology according to the state of the art, maximum divider frequencies of about 1 GHz can be attained with a classic bipolar frequency divider circuit. At higher frequencies, parasitic propagation-time effects predominate, so that considerably more stringent requirements are imposed upon the technology for manufacturing such frequency dividers.

An example of a classic (static) frequency divider circuit according to the prior state of the art, which is represented in simplified manner by gate symbols in FIG. 1 of the drawing, is based on a D-master-slave flipflop. This is understood to be a clock-controlled bistable multivibrator which serves for storing or placing in memory a logic variable and which, consequently has only a single data input (called "D"). The circuit, which should be considered to be a single flipflop, actually consists of two flipflops linked to one another; the first flipflop ("master") with the data input always determines the state of the second flipflop ("slave") with the data output. An objective or function of the D-flipflop is to permit the respective binary information present at the respective data input thereof to become effective only upon the arrival of the next clock signal, and to store it until the next following clock signal arrives. A frequency division exists if the inverted output signal is fed back to the data input: the output state then changes with every control clock flank.

In the circuit according to FIG. 1, the master 1 contains AND-gates A1 and A2 which are addressed, respectively by an inverted clock signal 3 and a circulating signal 4, on the one hand, and a clock signal 5 and a storage or memory signal 6, on the other hand, an OR gate 01 which combines the outputs of both AND-gates A1 and A2 and has its own output signal 6 which is fed-back in a storage or memory loop. The slave 2 is constructed accordingly: the AND gates A 3 and A 4 are addressed by the signals 5 and 6, on the one hand, and the signal 3 and the memory or storage signal 7, on the other hand, and their output signals are combined by OR gate 02. The output signal 7 of the OR gate 02 is simultaneously fed back in a storage or memory loop and the inverted signal 4 thereof in the circulating loop to the data input. Controlled by the clock signal 5, the circulating signal 4 which has a frequency half that of the clock frequency is alternatingly switched into conduction or is held in the circulating loop.

The output signal 6 of the master 1 is formed of the circulating signal 4 and the signal 6, each having the same significance. In operation, the signal 6 leads the signal 4 by 90°, which corresponds to one-half the clock frequency. The same applies to the signals 7 and 6 for the slave part of the circuit.

The maximum divider frequency is primarily determined by the resonance frequency of the divider circuit i.e. half the maximum divider frequency. The resonant circuit can be imagined as a sort of ring oscillator formed of 4 stages. According to FIG. 1, each stage is made up of one or two combining gate members or logic stages of which each has two input signals having a phase difference of one quarter period. In the case of resonance, the lagging input signal must correspond to the output signal. For the delay of the combined signal, for example the signals 4 and 6 to the output signal 6, only one eighth of a period, or a quarter of the clock frequency is thus available. If gates with a propagation time of 250 picoseconds are available, as is attainable with modern bipolar techniques, then the maximum divider frequency is 1 GHz.

The maximum divider frequency can at least double if the storage loops with the lagging signals 6 and 7 are removed and the gate propagation time is utilized for delaying the signals instead. The dynamic frequency divider then obtained is shown, in simplified form and with gate symbols, by way of example in FIG. 2.

The two inputs of a first AND gate A 5 are formed of the inverted clock signal 3 and the inverted output signal 4, the circulation signal. The output signal of the gate A 5 is connected, together with the clock signal 5, to the input of the AND gate A6, the output signal 7 of which has one-half the frequency of the clock signal 5 within the range of the resonance frequency.

Because the inertia of the gates themselves, in the dynamic divider according to FIG. 2, utilized for the intermediate storage of the circulating signal 4, the gate propagation time determines the frequency range of the divider frequency: Above the maximum frequency, the gate propagation time is too long, and below the minimum frequency, the gate propagation time is too short. Both frequency limits are relatively close to the inverted gate propagation time. Dynamic dividers are therefore not employable for many applications.

It is accordingly an object of the invention to provide a wideband frequency divider which has, with the same technology and by means of circuitry technology measures, a maximum divider frequency bandwidth which is at least twice as wide as that in the classical frequency divider circuit.

With the foregoing and other objects in view, there is provided, in accordance with the invention, a bipolar clock-controlled bistable multivibrator circuit arrangement having a static memory cell formed of a D-master-slave flipflop with a first inverted output signal fed back to a data input and with feedback loops, respectively, for intermediately storing output signals of the master and the slave, and a dynamic memory cell formed of the D-master-slave flipflop with a second inverted output signal fed back to the data input, the second inverted output signal having gate propagation times performing intermediate memory functions in place of the feedback loops, comprising a synchronizing device connected between the static and the dynamic memory cells for setting the circuit of the static memory cell in operation, at relatively low clock frequencies and for setting the circuit of the dynamic memory cell in operation at relatively high clock frequencies whereby the useful frequency range of the multivibrator is at least doubled.

In accordance with a concomitant feature of the invention, the synchronizing device has an analog mode of operation and comprises emitter followers for feeding intermediate memory signals of the static memory circuit into the dynamic memory circuit, and resistors connected to the emitter followers for summing respective output signals from both the static and the dynamic memory circuits.

Other features which are considered as characteristic for the invention are set forth in the appended claims.

Although the invention is illustrated and described herein as embodied in a Wideband Frequency Divider, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a schematic diagram of an exemplary circuit, represented with gate symbols, of a stable or static frequency divider according to the state of the art;

FIG. 2 is a schematic diagram of an exemplary circuit, represented with gate symbols, of a dynamic frequency divider according to the state of the art;

FIG. 3 is a schematic diagram of a circuit of a wideband frequency divider according to the invention, represented with gate symbols.

Figure 4:
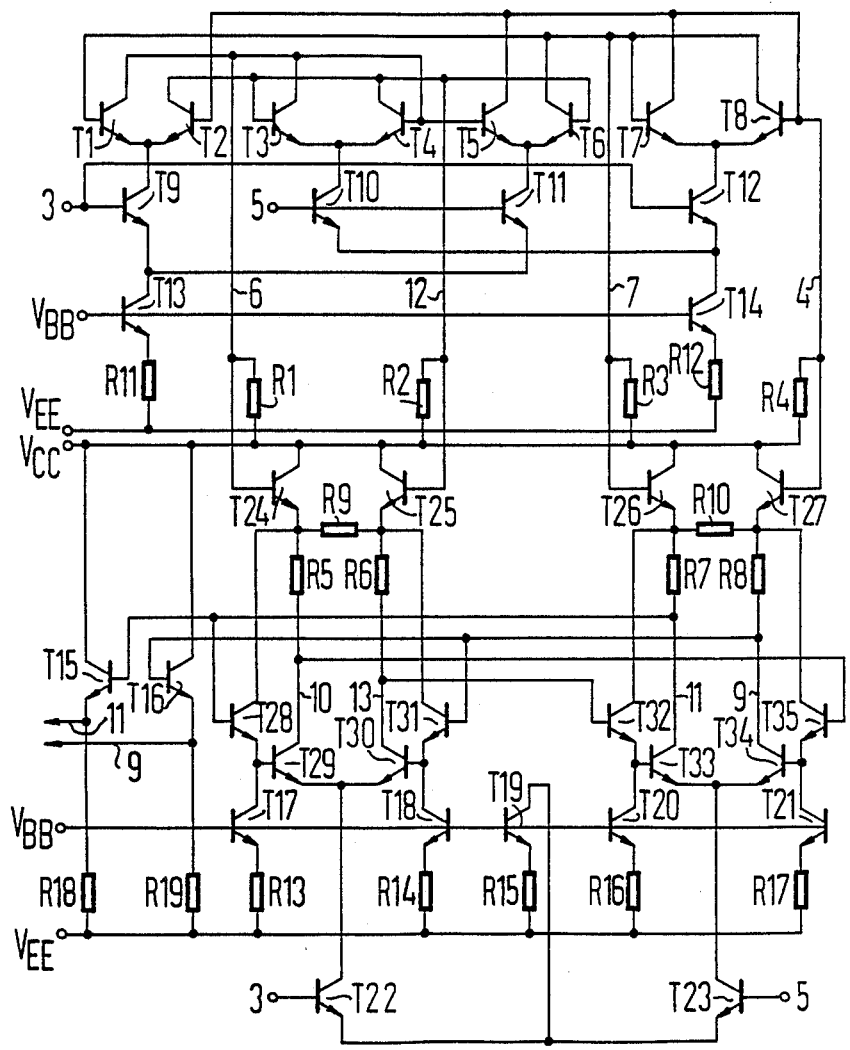
FIG. 4 is a circuit diagram of an embodiment of wideband frequency divider constructed in accordance with the invention.

It is a basic idea of the invention to combine the characteristics of the two frequency dividers to form a wideband frequency divider in such manner that, in the low-frequency range, it acts as a classic static frequency divider and, in the high-frequency range, as a fast dynamic frequency divider which is a delay circuit, having a master part and a slave part, each including an AND-Gate. FIG. 3 illustrates an embodiment, represented with gate symbols, of a circuit according to the invention. The frequency divider circuit of the invention has a static part 8 which largely agrees with the circuit according to FIG. 1. In the interest of clarity, it is noted that like elements are identified in FIG. 3 by the same reference characters as in FIG. 1. The difference is that the output signal 7 of the OR gate 02 is no longer simultaneously the output signal of the divider circuit, but rather, as in FIG. 1, leads in a storage loop to one input only of the AND gate A4. The dynamic part of the circuit is connected to the static part 8 in such a manner that the synchronization is accomplished by interlinking the master and slave signals of both circuit sections. The "master" part of the dynamic delay circuit is formed of an AND gate A7 having one input signal representing the inverted clock signal 3 and the other input signal a fed-back inverted output signal 9, and a following OR gate 03, which combines the output signal of the gate A7 and the output signal 6 of the static master. The output signal of the OR gate 03 represents an input signal of the AND gate A8. The output signal of the gate A8 which has, as a second input signal, the clock 5, is combined by the OR gate 04 with the inverted output signal 4 of the static divider 8 to form an output signal 11.

The synchronization of the dynamic delay circuit with the static circuit part 8 by means of the OR gates 03 and 04 ensures that, if the signals of the static circuit part 8 should fail to arrive, the error-free transition to the dynamic circuit part of the limit frequency thereof is exceeded, and vice versa. Of the possible ways of realizing the basic circuit diagram according to FIG. 3, FIG. 4 shows a circuit diagram of a frequency divider circuit according to the invention by way of example.

The circuit according to FIG. 4 operates with the respective complementary signals 6 and 12, on the one hand, and 7 and 4, on the other hand, in the static part, and respective complementary signals 10 and 13, on the one hand, and 11 and 9, on the other hand, in the dynamic circuit part which, respectively, address the inputs of signal-difference amplifier stages. The complementary clock signals 5 and 3 are applied accordingly to the inputs of differential amplifier stages having outputs which are respectively connected to the emitters of a signal differential stage. The series circuit obtained in this manner represents, respectively, an AND and a complementary NAND gate. The emitter resistors of the differential clock amplifier are replaced by current sources. Like current sources also contain emitter follower-controlled current switches in the dynamic circuit part of the frequency divider, which have inputs to which the respective complementary signals, 11 and 9, on the one hand, and 10 and 13, on the other hand, are connected, and outputs simultaneously forming the inputs of the corresponding differential amplifiers. The current switches additionally increase the characteristic resonance frequency for the dynamic divider and, thereby, the upper frequency limit of the overall circuit.

Essential for the functioning of the overall circuit is a synchronizing circuit between both parts which has enough influence upon the dynamic divider but causes no, or substantially no, additional delay of the dynamic circuit part. To this end, the respective complementary signals 6 and 12, on the one hand, and 7 and 4, on the other hand, of the static divider are fed to the dynamic divider via emitter followers. The interlinking of the corresponding digital signals of both circuit sections is accomplished by an analog voltage addition at the emitter resistors, which are simultaneously part of the load impedance and contribute with their inductive components to the acceleration. The complementary signals 11 and 9, coupled out via emitter followers, form the output signals of the frequency divider.

Because each circuit part is formed of two functional groups of identical construction, a description of a respective one of these functional groups and a statement of the correspondingly correlated components is sufficient. All of the illustrated transistors are of the npn type.

In the master 1 (slave 2) of the static part of the circuit, the clock signal 5 is connected to the base of the transistor T10 (T11), and the inverted clock signal 3 is connected to the base of the transistor T9 (T12). The transistors T9 and T11, on the one hand, and the transistors T10 and T12, on the other hand, form differential stages having emitter branches in which a respective current source is connected which contains the transistors T13 and T14. The emitters of these transistors T13 and T14 are connected via resistors R11 and R12 to a pole $V_{EE}$ of the supply voltage source, the bases of the transistors T13 and T14 to the auxiliary voltage $V_{BB}$, and the collectors of the transistors T13 and T14 to the load, namely the emitters of the transistors T9 and T11, on the one hand, and the transistors T10 and T12, on the other hand. The collector of transistor T9 (T11) is connected to the emitters of the differential stage formed by the transistors T1 and T2 (T5 and T6), which are addressed by the complementary signals 7 and 4 (6 and 12) which can be taken off in turn at the collectors of the transistors T6 and T5 (T1 and T2).

The collector of the transistor T10 (T12) is connected to the emitters of the differential stage formed by the transistors T3 and T4 (T7 and T8) which are addressed by the complementary signals 12 and 16 (7 and 4). At the collectors, the respective inverted inputs signals can be taken off i.e. the signals 6 and 12 (4 and 7).

The collectors of the transistors T1 and T3 (T6 and T8) and, similarly, the bases of the transistors T4 and T5 (T7 and T1) are connected via the resistor R1 (R3) to the pole $V_{CC}$ of the d-c supply voltage source. The collectors of the transistors T2 and T4 (T5 and T7) and, similarly, the bases of the transistors T3 and T6 (T8 and T2), respectively, are connected to the pole $V_{CC}$ of the d-c supply voltage via the resistor R2 (R4).

The transistors T2 and T9, on the one hand, and the transistors T4 and T10, on the other hand, form, with the inverter T3, the AND gates A1 and A2, and the transistors T5 and T11, on the one hand, and the transistors T7 and T12, on the other hand, form, with the inverter stage T8, the AND gates A3 and A4. The OR gates 01 and 02 are realized by the collector terminals of the transistor T1 (T6) and the inverter stage of the transistor T3 (T8).

A clock signal 5 at the transistors T10 and T11 switches the AND gates A2 and A3 into conduction, cuts off the transistors T3 and T6, on the one hand, and the transistors T2 and T8, on the other hand, respectively, and enables the bases of the transistors T1 and T7 which switch into conduction upon the inverted clock signal 3. The transistors T6 and T8 which are disposed in parallel on the output side continue to be cut off; the signals 7 and 4, respectively, are not changed. With the transistor T1, however, the signals 6 and 12, respectively, flip over; the latter enables the transistors T3 and T6 for the next clock signal 5, while the transistors T4 and T6 are cut off. When the clock transistors T10 and T11 are switched into conduction, the transistors T3 and T6 likewise flip over and invert the signals 7 and 4, respectively, while the signals 6 and 12, respectively, are not changed. Thus, besides the transistors T4 and T5, the transistors T1 and T7 are also cut off, while the transistors T2 and T8 are enabled for the inverted clock 3 which leaves the signals 7 and 4, respectively, unchanged and the signals 6 and 12, respectively, inverted. The cycle is repeated accordingly with the changes in the clock, the signals 6 and 12, respectively, and the signals 7 and 14, respectively, changing at one-half the clock frequency.

In the dynamic part of the frequency divider circuit, the transistors T22 and T23 form a differential stage. The emitters of both transistors T22 and T23 are connected to one another and to a current source i.e. the collector of the transistor T19, which has an emitter connected via a resistor R15 to the pole $V_{EE}$ of the supply voltage source, and a base to which the auxiliary voltage $V_{BB}$ is connected. The complementary clock signals 3 and 5 address the inputs of the differential stage, the signal 3 (5) being connected to the base of the transistor T22 (T23). The outputs of the differential stage are respectively connected in the emitter branch of a further differential amplifier stage. The collector of the transistor T22 (T23) is connected to the respective emitters of the transistors T29 and T30 (T33 and T34). The bases of the transistors are addressed via emitter follower-controlled current switches. Respective identical current sources thereof are formed of transistors T17 and T18 (T20 and T21), and have emitters which are connected via the resistors R13 and R14 (R16 and R17) to the pole $V_{EE}$ of the supply voltage source, and bases which are connected to the auxiliary voltage $V_{BB}$. The collectors are connected to the outputs of emitter followers T28 and T31 (T32 and T35) and to bases of transistors T29 and T30 (T33 and T34).

To the bases of the transistors T28 and T31 (T32 and T35), there are applied the complementary signals 11 and 9 (13 and 10) which are taken off at the collectors of the transistors T33 and T34 (T30 and T29). The collectors of the emitter followers, in turn, are connected to the outputs of further emitter followers T24 and T25 (T26 and T27), which have collectors connected to the pole $V_{CC}$ of the d-c voltage source, and bases via which the signals 6 and 12 (7 and 14) of the static divider are fed. The emitters of the transistors T24 and T25 (T26 and T27) are connected via the resistor R9 (R10) to one another and, via the resistors R5 and R6 (R7 and R8), the summing resistors for the static and dynamic divider signals are connected to the collectors of the transistors T29 and T30 (T33 and T34). The collectors of the transistors T33 and T34 lead further to the bases of the output emitter followers T15 and T16 which have collectors connected to the pole $V_{CC}$ and outputs which are connected, via the resistors R18 and R19, to the pole $V_{EE}$ of the supply voltage source. The output signals 9 and 11 can be taken off at the respective emitters or outputs of the emitter followers T15 and T16.

The transistors T22 and T30, on the one hand, and the transistors T23 and T34, on the other hand, correspond to the AND gates A7 and A8, respectively. Additional inverter stages are not necessary in the embodiment according to the invention because respective complementary signals are always available. For this reason and because of current switch technology which avoid saturation of the corresponding transistors because its base potential cannot become more positive than the collector potential, the gate propagation time which determines the maximum divider frequency and which is utilized for the intermediate storage or memory is shortened decisively. The complementary signal packets 9 and 11, on the one hand, and 10 and 13, on the other hand, oscillate at one-half the clock frequency between the transistor groups T28 and T31 and T32 to T35, respectively. The maximum divider frequency of the circuit according to the invention of FIG. 4 is 2.4 GHz. No phase problems occur in the synchronization of both circuit sections, because they are controlled by the same clock signals.

The foregoing is a description corresponding in substance to German application P 34 18 106.3 filed May 16, 1984, the International priority of which is being claimed for the instant application, and which is hereby made part of this application. Any material discrepancies between the foregoing specification and the aforementioned corresponding German application are to be resolved in favor of the latter.

There are claimed:

1. Bipolar clock-controlled bistable mutlivibrator comprising a static D-master-slave flip-flop and a dynamic master-slave delay circuit having a first and second AND-gate, each having a first and second input, said AND-gates forming respective dynamic master and slave delay circuits, the static slave flip-flop connected to the master flip-flop output and having an inverting and a non-inverting output; both said master and slave flop-flops connected to first and second clock signals inverted with respect to each other; synchronizing means forming part of said dynamic master-slave delay circuits including a first OR-gate and a second OR-gate having an inverting and non-inverting output, each OR-gate having a first and a second input; the static master flip-flop having first and second input means, each input means having first and second input leads, the first input means being controlled by said first clock connected to the first input lead thereof and by an output from the static master flip-flop connected to the second input lead thereof for interim storage of signals therein; the second input means of the master flip-flop being controlled by said inverted clock connected to the first input lead thereof and by an inverting output of the static slave flip-flop connected to the second input lead thereof; the non-inverting output of the static slave flip-flop being connected with an input means thereof for interim storage of signals therein; the inverting output of the second OR-gate being connected with the second input of the first AND-gate, the first AND-gate also being connected at its first input to said inverted clock; the first OR-gate being connected at its second input to the output of the first AND-gate, and at its first input to the output of the static master flip-flop; said first and second AND-gates having propagation delays serving for interim storage of signals therein; the second OR-gate having its first input connected to the inverting output of said static slave flip-flop, and the second input to the output of the second AND-gate; said second OR-gate having a non-inverting output for providing a divided clock output from said static master-slave flip-flop at low clock frequencies and a divided clock output from said master-slave circuit at high clock frequencies.

2. Circuit arrangement according to claim 1 wherein said synchronizing means comprise emitter followers for feeding interimly stored signals of the static master flip-flop into the second AND-gate, and resistors connected to said emitter followers for summing respective output signals from both said static master flip-flop and said dynamic master delay circuit.

* * * * *